May 9, 1961 D. W. DODGE 2,983,879
TRANSISTOR OSCILLATOR
Filed Oct. 21, 1957
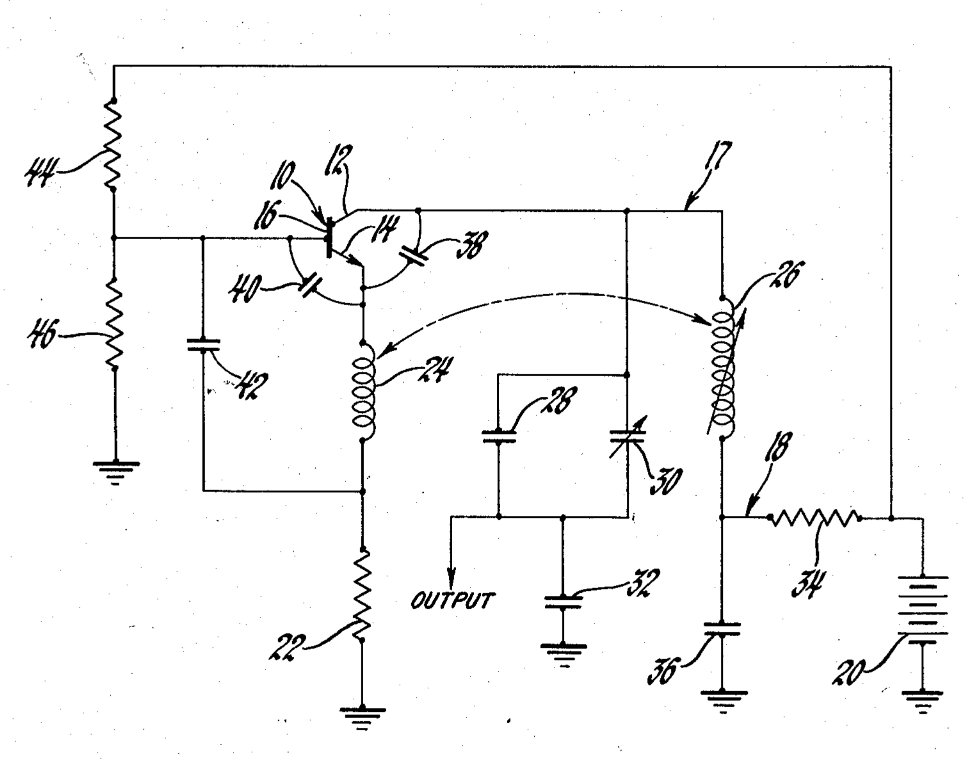
INVENTOR.
David W. Dodge
BY E. W. Christen
ATTORNEY United States Patent Office 2,983,879

Patented May 9, 1961

2,983,879

TRANSISTOR OSCILLATOR

David W. Dodge, Kokomo, Ind., assignor to General Motors Corporation, Detroit, Mich., a corporation of Delaware Filed Oct. 21, 1957, Ser. No. 691,260

1 Claim. (Cl. 331—117)

This invention relates to transistor oscillators and more particularly to an oscillator circuit providing improved frequency stability characteristics.

In many applications of transistor oscillators, it is necessary to obtain frequency stability under conditions of varying supply voltage. For example, the high frequency oscillator of an automobile radio receiver is commonly energized from the automobile battery which delivers a fluctuating voltage. In some applications of the transistor oscillator the supply voltage variation may be occasioned by variations in loading on the oscillator. Where a variable frequency oscillator is used as the heterodyne source in a receiver, tracking of the oscillator frequency with the frequency of other variably tuned circuits is important and, therefore, frequency stability over a wide range is necessary. In the mass production of such oscillator circuits, it is necessary to achieve uniformity in the frequency characteristics of the oscillator circuits to permit interchangeability.

At the operating frequency of such oscillators, the interelectrode capacitance becomes appreciable and introduces difficulty in obtaining the desired frequency stability. Recognizing that the interelectrode capacitances of a transistor vary in value as a function of the voltage applied to the electrodes and vary among successive transistors, a circuit arrangement is provided for minimizing the effect of these variations. By compensating one deleterious variation by another and by limiting the extent of variation, the frequency determining circuit of the oscillator is substantially unaffected and the frequency of operation is stabilized. This is accomplished by a supply voltage circuit for the transistor electrodes which causes the voltage change on one to be dependent upon the voltage change on the other in a predetermined relation. Additionally, the effect of variations in interelectrode capacitance among successive transistors is minimized by providing a condenser of predetermined value across the transistor electrodes and in circuit with the interelectrode capacitance so that the effective value of capacitance is maintained at a fixed maximum value. Thus, the effect of variation on the frequency determining circuit is limited and the operating frequency is further stabilized.

A more complete understanding of this invention may be had from the detailed description which follows taken with the accompanying drawings in which the single figure is a schematic diagram of the inventive oscillator circuit.

Referring now to the drawing, there is shown an illustrative embodiment of the invention in a feedback oscillator of the tuned collector oscillator type adapted for variable frequency sine wave oscillation in class C operation. The oscillator circuit comprises a transistor 10 of the junction type which is suitably a NPN transistor having a collector electrode 12, emitter electrode 14 and base electrode 16. The transistor is provided with an output circuit extending from the collector electrode 12 to the emitter electrode 14 and which includes a frequency determining circuit 17, a filter section 18 and the direct voltage source or battery 20 having one terminal connected to a point of reference potential or ground. This output circuit is completed from ground through the emitter circuit resistor 22 and the tickler or feedback winding 24 to the emitter electrode 14. The frequency determining circuit 17 is a parallel resonant circuit including a transformer primary winding or variable inductor 26 inductively coupled as indicated to the feedback winding 24. Parallel condenser 28 and trimmer condenser 30 are connected from one terminal of the inductor 26 to ground through the series condenser 32. The filter section 18 includes a series resistor 34 between the battery 20 and inductor 26 and includes a shunt condenser 36 connected to ground for eliminating extraneous frequencies from the oscillator which might be introduced through the supply voltage circuit. The battery 20 is subject to fluctuations in voltage value over a relatively wide range, as in the case of an automobile storage battery. The output circuit also effectively includes the interelectrode capacitance between the collector and emitter electrodes which is represented as a lumped capacitance by the condenser 38. The capacitance of condenser 38 varies as a function of the voltage impressed upon the collector electrode 12 and this capacitance operates in conjunction with the frequency determining circuit 17 to increase the resonant frequency as the voltage is increased.

The input circuit of the oscillator includes a common path with the output circuit from the emitter electrode 14 through the feedback winding 24 and emitter circuit resistor 22 to ground. The input circuit also includes the interelectrode capacitance between the base electrode 16 and emitter electrode 14 which is represented as a lumped capacitance by the condenser 40. The circuit is additionally provided with a condenser 42 connected between the base electrode 14 and the junction of feedback winding 24 and resistor 22. The condenser 42 has a capacitance of the same order of magnitude and is preferably less than the interelectrode capacitance represented by condenser 40. It is noted that the condensers 40 and 42 are effectively connected in series across the feedback winding 24. To provide a bias voltage for the input circuit, a pair of voltage divider resistors 44 and 46 are connected in series across the battery 20. The base electrode 16 is connected to the junction of the voltage divider resistors and the base emitter circuit is thereby biased in the forward direction with a voltage subject to fluctuations proportional to the variations in the battery voltage value. The value of condenser 40 varies as a function of the voltage impressed on the base electrode and influences the frequency determining circuit 17 in such manner that the resonant frequency decreases with an increase in base electrode voltage. The frequency sensitivity to voltage change on the base electrode bears a predetermined relation to the frequency sensitivity to voltage change on the collector electrode. In order to minimize the effect of voltage variation the resistors 44 and 46 are proportioned with relation to each other and the resistance of the input circuit so that the voltage division effected thereby corresponds to this predetermined relation.

A feedback path is provided from the output circuit to the input circuit by the aforementioned inductive coupling of the inductor 26 and feedback winding 24. This inductive coupling is properly phased to provide a regenerative feedback to the input circuit to sustain oscillations in the output circuit.

In operation of the inventive oscillator circuit, the frequency of oscillation is determined primarily by the frequency determining, parallel resonant circuit 17. The frequency of oscillation may be varied over a wide range by varying the inductance of the inductor 26. If the voltage value of battery 20 should increase, the voltage impressed on the collector electrode 12 will likewise increase and tend to produce an increased oscillating frequency. However, a corresponding increase in voltage will be impressed upon the base electrode 16 in a predetermined relation to the increased collector voltage and will tend to decrease the operating frequency. The inverse relation obtains upon a decrease of battery voltage. Consequently, the two effects tend to cancel each other and will result in a minimum deviation of frequency from the value established by the adjustment of inductor 26. It is to be noted that a voltage of the oscillation frequency is developed across the emitter resistor 22 which has the phase relation corresponding to degenerative feedback, since the base is returned to ground through the comparatively low impedance of resistors 44 and 46 in parallel. The amount of negative feedback may be adjusted in conjunction with the regenerative feedback through winding 24 and condenser 42 to reduce the effect of variations of the interelectrode capacitance represented by condenser 40 and results in improved isolation. By virtue of the inductive coupling between the feedback winding 24 and the inductor 26, variations of interelectrode capacitance represented by the condenser 40 tend to be reflected into the parallel resonant circuit 17 with a consequent variation of resonant frequency. However, the condenser 42 is effectively in series connection with the condenser 40 and is of constant value. As a result, the reflected capacitance is limited to a value corresponding to that of condenser 42 which prevents frequency deviations from exceeding a predetermined maximum by reason of variations of the interelectrode capacitance. As indicated in the drawing, the useful output voltage at the oscillation frequency is suitably derived across condenser 32.

Although the invention has been described with respect to a particular embodiment, such description is not to be construed in a limiting sense. Numerous modifications and variations within the spirit and scope of the invention will now occur to those skilled in the art. For a definition of the invention, reference is made to the appended claims.

I claim:

A transistor oscillator comprising a transistor having emitter, collector, and base electrodes, a resonant circuit and a voltage source serially connected between the collector electrode and ground, said resonant circuit including a transformer primary winding, the secondary winding of the transformer and a resistor being connected serially between said emitter electrode and ground, a pair of voltage divider resistors serially connected across said voltage source, and said base electrode being connected to the junction of the voltage divider resistors, and a condenser connected between the base electrode and the junction of said secondary winding and said resistor whereby positive feedback is supplied to the base to emitter circuit by the secondary winding to sustain oscillations in the collector to emitter circuit and a measure of negative feedback is supplied to the base to emitter circuit by said resistor tending to reduce changes in the base to emitter interelectrode capacitance.

References Cited in the file of this patent

UNITED STATES PATENTS

| | | |
|---|---|---|
| 1,940,833 | Andrew | Dec. 26, 1933 |
| 2,776,372 | Ensink et al. | Jan. 1, 1957 |
| 2,811,643 | Eberhard | Oct. 29, 1957 |
| 2,855,568 | Lin | Oct. 7, 1958 |

OTHER REFERENCES

"Stable Transistor Oscillator," by Keonjian, in Electrical Engineering, pages 672–675, August 1955.